(12) United States Patent
Jeon et al.

(10) Patent No.: US 8,822,341 B2
(45) Date of Patent: Sep. 2, 2014

(54) METHODS OF MANUFACTURING SEMICONDUCTOR DEVICES

(75) Inventors: Yong-Ho Jeon, Hwaseong-si (KR); Dong-Hyun Kim, Hwaseong-si (KR); Je-Woo Han, Hwaseong-si (KR); Kyoung-Sub Shin, Seongnam-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 315 days.

(21) Appl. No.: 13/164,090

(22) Filed: Jun. 20, 2011

(65) Prior Publication Data
US 2011/0318930 A1    Dec. 29, 2011

(30) Foreign Application Priority Data

Jun. 28, 2010  (KR) .................. 10-2010-0060948

(51) Int. Cl.
*H01L 21/302* (2006.01)
*H01L 21/3065* (2006.01)
*H01L 21/768* (2006.01)

(52) U.S. Cl.
CPC .... *H01L 21/30655* (2013.01); *H01L 21/76898* (2013.01)
USPC ........... 438/694; 438/695; 438/699; 438/700; 438/714; 216/67

(58) Field of Classification Search
CPC .............. H01L 21/30655; H01L 21/76805; H01L 21/76898; H01L 21/0234; H01L 21/02631
USPC ............ 216/67; 438/694, 695, 699, 700, 714
See application file for complete search history.

(56) References Cited

U.S. PATENT DOCUMENTS

| 6,051,503 | A  | * | 4/2000 | Bhardwaj et al. ............ 438/705 |
| 6,784,108 | B1 | * | 8/2004 | Donohoe et al. ............ 438/706 |
| 2003/0134038 | A1 | * | 7/2003 | Paranjpe ................ 427/248.1 |
| 2004/0123803 | A1 | * | 7/2004 | Strang ................... 118/723 E |
| 2005/0181555 | A1 | * | 8/2005 | Haukka et al. .............. 438/232 |

FOREIGN PATENT DOCUMENTS

| KR | 10-0230981 B1 | 11/1999 |
| KR | 2006-0135839 A | 12/2006 |
| KR | 10-0746910 B1 | 8/2007 |

* cited by examiner

*Primary Examiner* — Binh X Tran
(74) *Attorney, Agent, or Firm* — Harness, Dickey & Pierce, P.L.C.

(57) ABSTRACT

A first gas for plasma etch and a second gas for plasma deposition are introduced onto a semiconductor substrate, the semiconductor substrate including a mask pattern. A flow rate of the first and second gases is periodically changed within a range of flow rates during a process cycle, such that a plasma etch process and a plasma deposition process are performed together to form an opening in the semiconductor substrate.

20 Claims, 7 Drawing Sheets

METHODS OF MANUFACTURING SEMICONDUCTOR DEVICES

CROSS-REFERENCE TO RELATED APPLICATION

This application claims priority under 35 U.S.C. §119 to Korean Patent Application No. 2010-0060948, filed on Jun. 28, 2010 in the Korean Intellectual Property Office (KIPO), the entire contents of which is incorporated herein by reference.

BACKGROUND

1. Field

Example embodiments relate to methods of manufacturing semiconductor devices.

2. Description of the Related Art

Generally, in a method of manufacturing a semiconductor device such as a stack semiconductor package, an opening (through hole) may be formed in a semiconductor substrate and the opening may be filled with a conductive material to form a plug. For example, the opening may be formed by a dry etch process.

A conventional Bosch process may be performed to form the opening in the semiconductor substrate. However, in a conventional Bosch process, there is a trade-off between an etch rate and a scalloped sidewall roughness of the opening. Accordingly, the etch rate is increased to reduce process time, and thus, a surface roughness of the opening may be deteriorated.

SUMMARY

Example embodiments provide methods of forming an opening with excellent and/or improved surface roughness at a high and/or increased etch rate. Example embodiments may provide methods of manufacturing semiconductor devices using the above-mentioned method.

According to example embodiments, in a method of manufacturing a semiconductor device, a first gas for plasma etching and a second gas for plasma deposition are introduced onto a semiconductor substrate. The semiconductor substrate is selectively exposed by a mask pattern. A flow rate of the first and second gases is periodically changed within a predetermined range during a process cycle, such that a plasma etching process and a plasma deposition process are performed together to form an opening in the semiconductor substrate.

In at least one example embodiment, forming the opening may include supplying the first gas with a first phase, and supplying the second gas with a second phase different from the first phase. In at least one example embodiment, the phase difference between the first gas and the second gas may be about 180°. In at least one example embodiment, the total amount of the first gas and the second gas versus time may be constant over the process cycle. In at least one example embodiment, when the amount of flow of the first gas is the maximum value, the amount of flow of the second gas may be the minimum value. In at least one example embodiment, the maximum amount of flow of the first gas may be substantially the same as the maximum amount of flow of the second gas.

In at least one example embodiment, the minimum amount of flow of the first gas may be substantially the same as the minimum amount of flow of the second gas. In at least one example embodiment, when the amount of flow of the first gas is gradually increased, the amount of flow of the second gas may be gradually decreased. In at least one example embodiment, the flow rate of the first and second gases may be greater than 1 during a first time of the process cycle and the flow rate of the first and second gases may be smaller than 1 during a second time of the process cycle next to the first time. In at least one example embodiment, the first gas may include $SF_6$ and the second gas may include $C_4F_8$.

According to example embodiments, in a method of manufacturing a semiconductor device, a mask pattern is formed on a semiconductor substrate to selectively expose the semiconductor substrate. A first gas for plasma etching and a second gas for plasma deposition are introduced onto the semiconductor substrate selectively exposed by the mask pattern. A flow rate of the first and second gases is periodically changed within a predetermined range during a process cycle, such that a plasma etching process and a plasma deposition process are performed together to form an opening in the semiconductor substrate. A plug is formed in the opening. A connection member is formed on the plug. Another semiconductor device is stacked on the semiconductor substrate such that the connection member is electrically connected to another semiconductor device.

In at least one example embodiment, forming the opening may include supplying the first gas with a first phase and supplying the second gas with a second phase different from the first phase. In at least one example embodiment, the phase difference between the first gas and the second gas may be about 180°. In at least one example embodiment, the total amount of the first gas and the second gas versus time may be constant over the process cycle. In at least one example embodiment, when the amount of flow of the first gas is the maximum value, the amount of flow of the second gas may be the minimum value. In at least one example embodiment, the maximum amount of flow of the first gas may be substantially the same as the maximum amount of flow of the second gas.

In at least one example embodiment, the minimum amount of flow of the first gas may be substantially the same as the minimum amount of flow of the second gas. In at least one example embodiment, when the amount of flow of the first gas is gradually increased, the amount of flow of the second gas may be gradually decreased. In at least one example embodiment, the flow rate of the first and second gases may be greater than 1 during a first time of the process cycle and the flow rate of the first and second gases may be smaller than 1 during a second time of the process cycle next to the first time. In at least one example embodiment, the first gas may include $SF_6$ and the second gas may include $C_4F_8$.

According to example embodiments, a first gas for plasma etching and a second gas for plasma deposition may be introduced together onto a semiconductor substrate. A flow rate of the first and second gases may be changed periodically such that a plasma etching process and a plasma deposition process are performed together to form an opening in the semiconductor substrate. Accordingly, the plasma etching process due to the first gas may be performed with the plasma deposition process due to the second gas during the same step of process cycle. Accordingly, even though the plasma etching process due to the first gas is mainly performed to increase an etching ratio, the plasma deposition process due to the second gas may be performed together with the plasma etching process to protect a sidewall of the etched opening, thereby forming the opening having an excellent and/or improved surface roughness.

According to at least one example embodiment, a method of manufacturing a semiconductor device includes introducing a first gas for plasma etching and a second gas for plasma deposition into a plasma processing apparatus in which a semiconductor substrate is mounted, and periodically varying flow rates of the first and second gases within a range of flow rates during a process cycle such that a plasma etch process and a plasma deposition process are performed together to form an opening in the semiconductor substrate.

According to at least one example embodiment, a method of manufacturing a semiconductor device includes forming a mask pattern on a first semiconductor substrate, introducing a first gas for plasma etching and a second gas for plasma deposition into a plasma processing apparatus in which the semiconductor substrate is mounted, forming an opening in the semiconductor substrate by periodically varying flow rates of the first and second gases within a range of flow rates during a process cycle such that a plasma etch process and a plasma deposition process are performed together, forming a plug in the opening, forming a connection member on the plug, and stacking a second semiconductor substrate on the first semiconductor substrate such that the connection member electrically connects the first and second substrates.

According to at least one example embodiment, an etch method includes varying a flow rate of a first process gas in a process apparatus according to a first periodic function during a process cycle, and varying a flow rate of a second process gas in the process apparatus according to a second periodic function during the process cycle.

BRIEF DESCRIPTION OF THE DRAWINGS

Example embodiments of the inventive concepts will be more clearly understood from the following brief description taken in conjunction with the accompanying drawings. FIGS. 1-9E represent non-limiting, example embodiments as described herein.

FIG. 1 is a cross-sectional schematic illustrating plasma processing apparatuses according to example embodiments FIG. 2 is a cross-sectional diagram illustrating a mask pattern on a semiconductor substrate;

FIG. 3 is a cross-sectional diagram illustrating an opening formed using the plasma processing apparatus in FIG. 1 according to example embodiment;

FIG. 5 is a graph of first and second gas flow rates as a function of time for a process cycle of six steps according to example embodiments;

FIGS. 6 and 7 are graphs illustrating results of the process cycle in FIG. 5;

FIG. 8 is a graph of first and second gas flow rates as a function of time for a process cycle of ten steps according to example embodiments; and FIGS. 9A-9E are cross-sectional diagrams illustrating methods of manufacturing semiconductor devices according to example embodiments.

Figure 1:
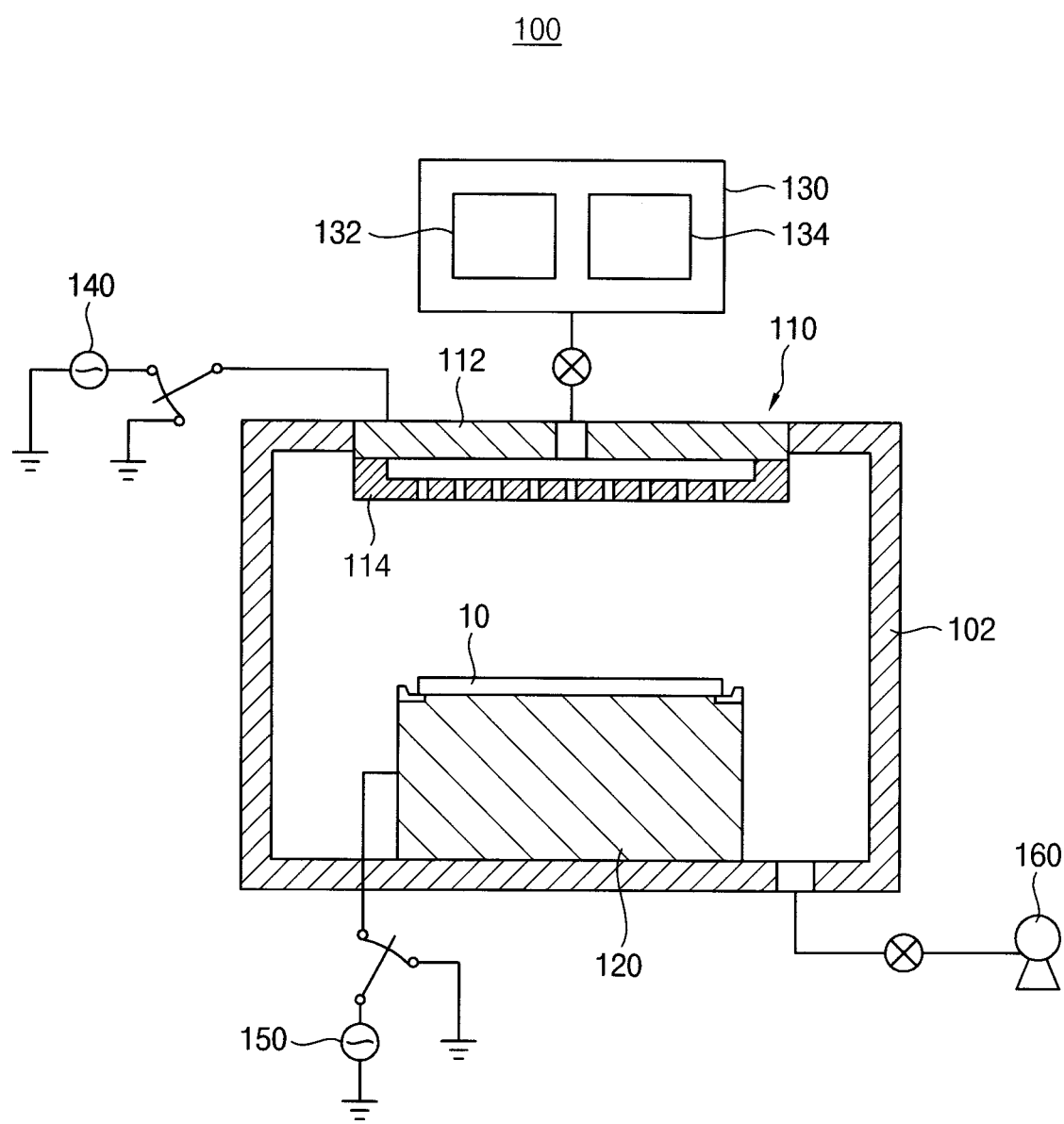

It should be noted that these figures are intended to illustrate the general characteristics of methods, structure and/or materials utilized in certain example embodiments of the inventive concepts and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments will now be described more fully with reference to the accompanying drawings, in which example embodiments are shown. Example embodiments may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 is a cross-sectional schematic illustrating plasma processing apparatuses according to example embodiments of the inventive concepts. Referring to FIG. 1, a plasma processing apparatus 100 may include a chamber 102 and a plasma generator for generating plasma in the chamber 102. According to example embodiments, the plasma generator may generate plasma within the chamber 102 using plasma power (RF power). The plasma generator may include a gas introducing portion 130 and a high frequency generator. The high frequency generator may supply high frequency power to gas within the chamber 102 to generate plasma within the chamber 102. The high frequency generator may include an upper electrode 110, a source power supplier 140, a lower electrode 120 and a bias power supplier 150.

The upper electrode 110 may be in an upper portion of the chamber 102. The upper electrode 110 may include a first electrode 112 and a second electrode 114. The second electrode 114 may be positioned under the first electrode 112 and may be connected to a lower surface of the first electrode 112. The first electrode 112 may be disk shaped and the shape of the second electrode 114 may correspond to the first electrode 112. The source power supplier 140 may be connected to the upper electrode 110 by a first switch to apply source power to the first electrode 112. The lower electrode 120 may be provided on a bottom of the chamber 102. A semiconductor substrate 10 may be supported on an upper surface of the lower electrode 120.

The lower electrode 120 may support the semiconductor substrate 10 on the upper surface using, for example, vacuum absorption force and/or electrostatic force. The bias power supplier 150 may be connected to the lower electrode 120 by a second switch to supply bias power to the lower electrode 120. It is understood that the high frequency generator should not be construed as limited to the above-mentioned construction and the high frequency generator may have various con-figurations for plasma processing. A gas exhauster may be provided in a side portion of the chamber 102. The gas exhauster may include a vacuum pump 160 that may be connected to the chamber 102. The gas exhauster may evacuate gas and/or a residual product from the chamber 102.

According to example embodiments, the gas introducing portion 130 may include a first gas introducer 132 and a second gas introducer 134. The first gas introducer 132 may provide a first gas for plasma etching and the second gas introducer 134 may provide a second gas for plasma deposition. For example, the first gas may include at least $SF_6$ and the second gas may include at least $C_4F_8$.

Figure 2:
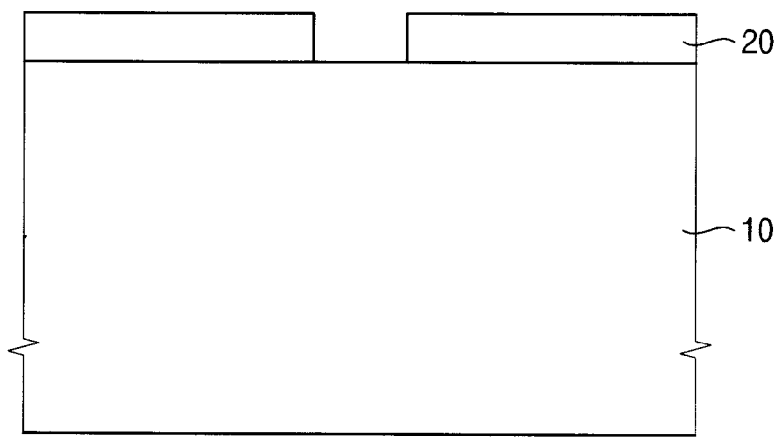
Figure 3:
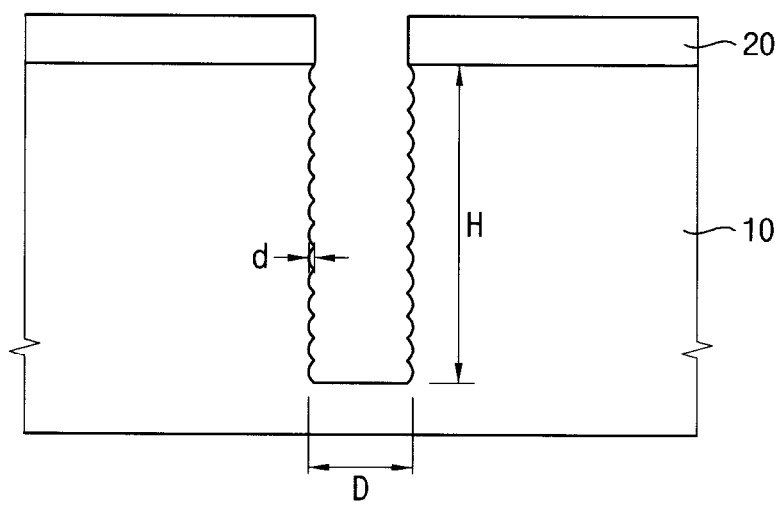

FIG. 2 is a cross-sectional diagram illustrating a mask pattern on a semiconductor substrate. FIG. 3 is a cross-sectional diagram illustrating an opening formed using the plasma processing apparatus in FIG. 1 according to example embodiments. Referring to FIGS. 2 and 3, a mask pattern 20 may be formed on a substrate 10 (e.g., a semiconductor substrate) to partially expose an upper surface of the semiconductor substrate 10. For example, the semiconductor substrate 10 may be a wafer including silicon. A photoresist layer, for example, may be formed on the semiconductor substrate 10 and then may be patterned to form the mask pattern 20.

According to example embodiments, an insulation layer may be formed on the semiconductor substrate 10, a mask pattern 20 may be formed on the insulation layer and may be used as an etch mask to form an opening in the insulation layer. For example, the insulation layer may include silicon oxide.

The semiconductor substrate 10 may be loaded into the chamber 102. A first gas for plasma etching and a second gas for plasma deposition may be introduced into the chamber 102. An inert gas may be introduced into the chamber 102 together with the first and second gases. Plasma power may be applied to generate plasma within the chamber 102. For example, a pressure of the chamber 102 may range from about 10 mT to about 90 mT, RF power may range from about 1000 W to about 3000 W and a bias voltage may range from about 200 V to about 600 V.

The first gas may be activated to etch the semiconductor substrate 10 in a vertical direction (plasma etch process), and the second gas may be activated to form a protection layer on a sidewall of the etched opening (plasma deposition (passivation) process). As illustrated in FIG. 3, an opening with a desired depth (H) and width (D) may be formed. A surface roughness of the scalloped sidewall of the opening may be a depth (d).

Figure 4A:
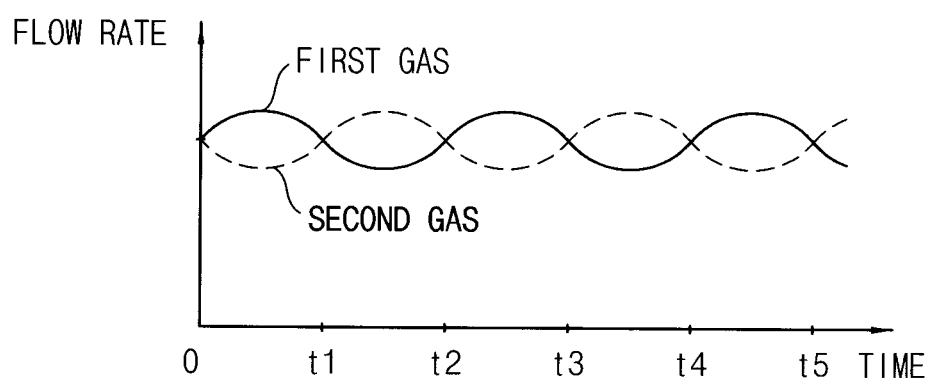
FIG. 4A is a graph of first and second gas flow rates as a function of time according to example embodiments.
Figure 4B:
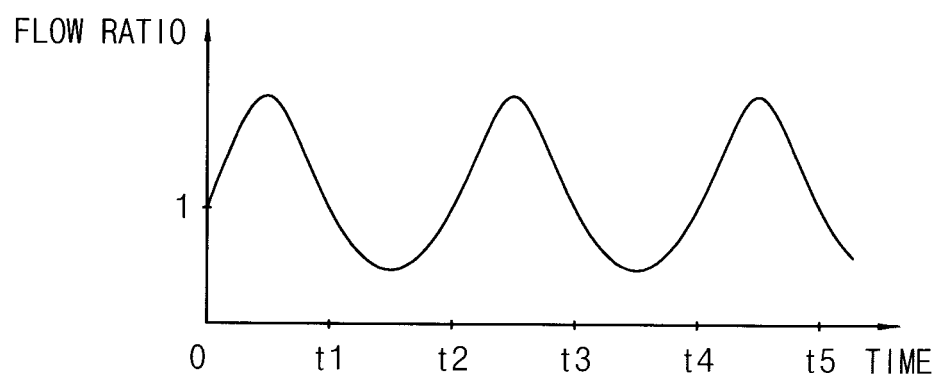
FIG. 4B is a graph of a ratio of a first gas flow rate to a second gas flow rate as a function of time according to example embodiments.

FIG. 4A is a graph of first and second gas flow rates as a function of time according to example embodiments. FIG. 4B is a graph of a ratio of a first gas flow rate to a second gas flow rate as a function of time according to example embodiments. According to example embodiments, a flow rate of a first gas may be changed periodically within a range of flow rates and a flow rate of second gas may be changed periodically within a range of flow rates. The total amount of the first gas and the second gas as a function of time may be constant over a process cycle.

For example, the flow rate of the first gas may range from about 100 sccm to about 400 sccm, and the flow rate of the second gas may range from about 100 sccm to about 400 sccm. The flow rate of the first gas may vary periodically and have a first phase and the flow rate of the second gas may vary periodically and have a second phase different from the first phase. The difference between the first phase and the second phase may be from about 90° to about 180°.

As illustrated in FIGS. 4A and 4B, the phase difference between the first gas and the second gas may be 180°. When the flow rate of the first gas is a maximum value, the flow rate of the second gas may be a minimum value. When the flow rate of the first gas is the minimum value, the flow rate of the second gas may be at the maximum value. The maximum flow rate of the first gas may be the same as the maximum flow rate of the second gas. The minimum flow rate of the first gas may be the same as the minimum flow rate of the second gas.

According to at least one example embodiment, the flow rates of the first second gases may vary periodically during the process cycle. When the flow rate of the first gas is gradually increased, the flow rate of the second gas may be gradually decreased. When the flow rate of the first gas is gradually decreased, the flow rate of the second gas may be gradually increased. As illustrated in FIG. 4B, a ratio of the flow rate of the first gas to the flow rate of the second gas may be greater than 1 during a first time (0~t1, t2~t3, t4~t5) of one process cycle. The ratio of the flow rate of the first gas to the flow rate of the second gas may be less than 1 during a second time (t1~t2, t3~t4) of one process cycle.

During the first time of one process cycle, the plasma etch process due to the first gas may be predominant over the plasma deposition process. During the second time of one process cycle, the plasma deposition process due to the second gas may be predominant over the plasma etch process. According to at least one example embodiment, both the first gas and the second gas may be supplied into the chamber with flow rates varying over time such that both the plasma etch process and the plasma deposition process may be performed on the substrate. The plasma etch process due to the first gas may be performed with the plasma deposition process due to the second gas.

Even though the plasma etch process due to the first gas may be mainly performed to increase an etch ratio, the plasma deposition process due to the second gas may be performed together with the plasma etch process to protect a sidewall of the etched opening, and thereby an opening having an excellent and/or improved surface roughness may be formed.

Figure 5:
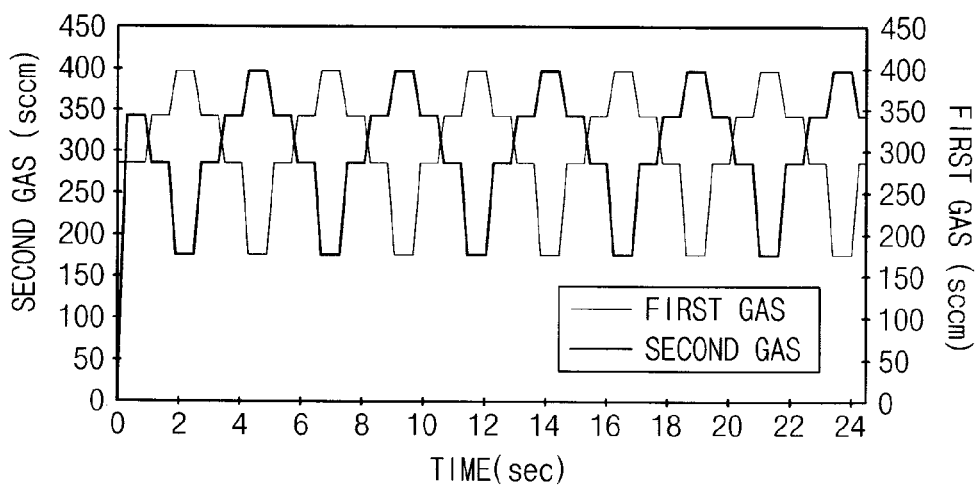
Figure 6:
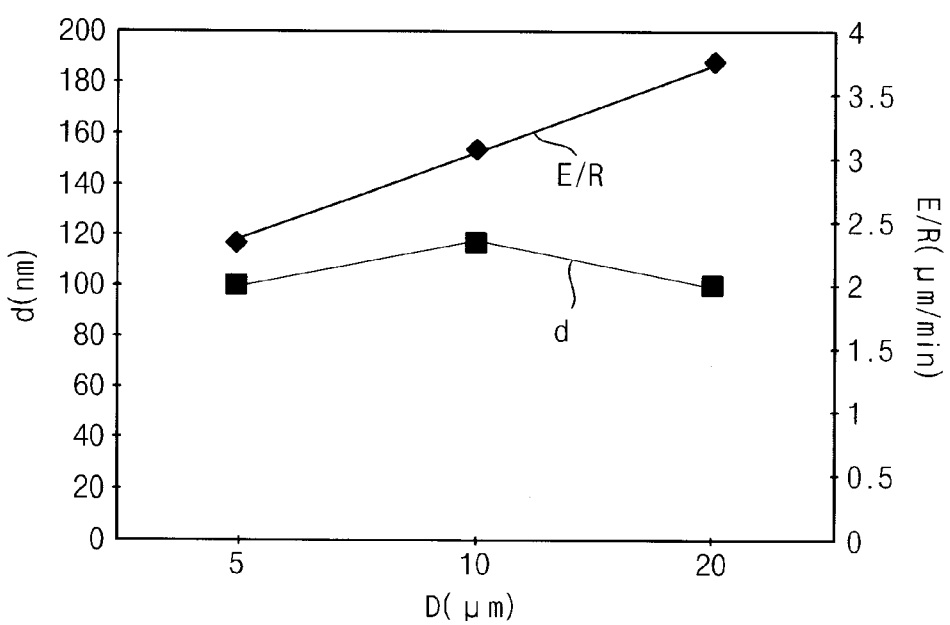
Figure 7:
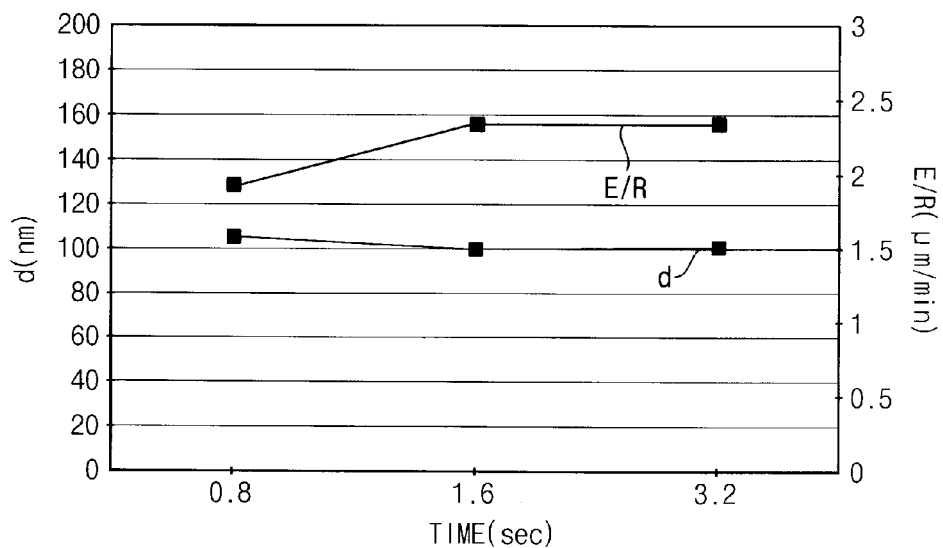

FIG. 5 is a graph of first and second gas flow rates as a function of time for a process cycle of six steps (e.g., 6 transitions per period) according to example embodiments. FIGS. 6 and 7 are graphs illustrating results of performing the process cycle in FIG. 5. Referring to FIG. 5, a first gas (e.g., $SF_6$) may be introduced into the chamber and a flow rate of the first gas may be varied between about 200 sccm to about 400 sccm. A second gas (e.g., $C_4F_8$) may be introduced into the chamber and a flow rate of the second gas may be varied between about 200 sccm to about 400 sccm. The phase difference between the first gas and the second gas may be 180°.

FIG. 6 represents a scalloped sidewall depth (d) and an etch rate (E/R) as a function of a width (D) of an opening. In a conventional Bosch process, as a width (D) of an etched opening increases, an etch rate (E/R) increases and a surface roughness of the opening may be deteriorated. Referring to FIG. 6, in a method of forming an opening according to example embodiments, even though an etch rate (E/R) may be increased according to the increased width (D), the opening may have a substantially constant surface roughness. The scalloped sidewall depth (d) may be about constant regardless of an increase of the etch rate.

FIG. 7 represents a scalloped sidewall depth (d) and an etch rate (E/R) as a function of step time in a process cycle. In a conventional Bosch process, as step time of a process cycle is increased, an etch rate (E/R) is increased and a surface roughness of the opening is deteriorated. Referring to FIG. 7, in a method of forming an opening according to at least one example embodiment, even though an etch rate (E/R) is increased according to an increased step time, a surface roughness of the opening may be about constant. The scalloped sidewall depth (d) may be about constant regardless of an increase in the etch rate.

In a method of forming an opening according to example embodiments of the inventive concepts, a scalloped sidewall depth (d) may be not correlate with an etch rate. An opening with excellent and/or improved surface roughness may be formed in a process including a high and/or increased etch rate.

Figure 8:
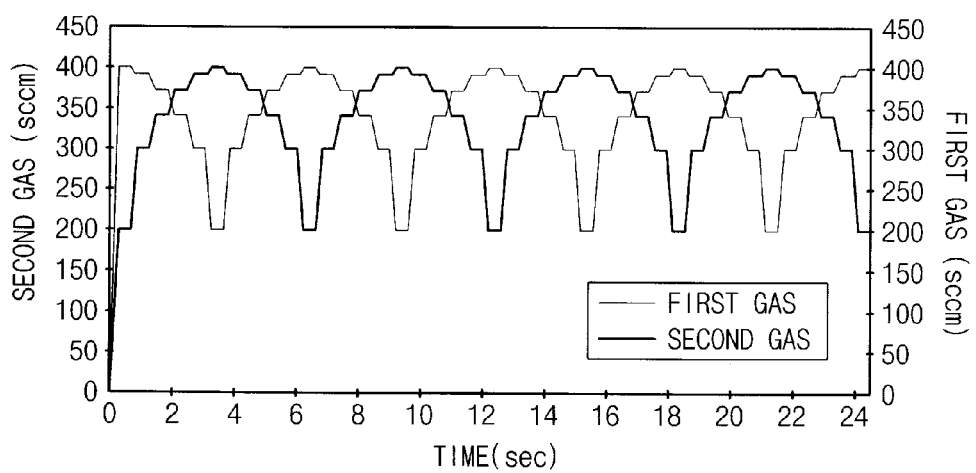

FIG. 8 is a graph of first and second gas flow rates as a function of time for a process cycle of ten steps (e.g., 10 transitions per period) according to example embodiments. Referring to FIG. 8, a first gas (e.g., $SF_6$) may be introduced into a chamber with a periodically varying flow rate, the flow rate within a range of about 200 sccm to about 400 sccm and a second gas ($C_4F_8$) may be introduced into the chamber with a periodically varying flow rate, the flow rate within a range of about 200 sccm to about 400 sccm. The phase difference between the first gas and the second gas may be 180°. It is understood that the flow rate, flow ratio and phase difference of first and second gases may be selected based on plasma processes and shapes of a desired opening.

Figure 9A:
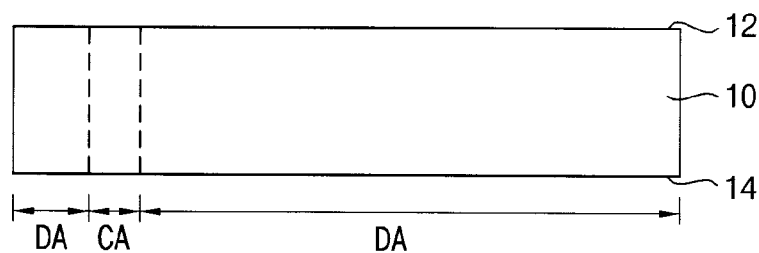

FIGS. 9A-9E are cross-sectional diagrams illustrating methods of manufacturing semiconductor devices according to example embodiments. Referring to FIG. 9A, a semiconductor substrate 10 including semiconductor chips formed therein may be prepared. The semiconductor substrate 10 may include a first surface 12 and a second surface 14 opposite to the first surface 12. According to at least one example embodiment, the substrate 10 may be a silicon wafer. The wafer may include a die region (DA) and a cutting region (CA). The semiconductor chips may be formed in the die region (DA). The semiconductor chips may be separated by the cutting region (CA). The cutting region (CA) may be partially removed by a saw process to separate the semiconductor chips.

Figure 9B:
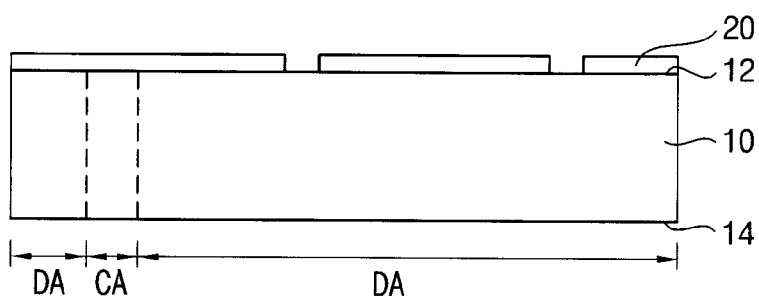

A plurality of chip pads (not illustrated) may be formed on the first surface 12 of the substrate 10. The preliminary semiconductor chip may include a plurality of circuit elements formed therein. Input/output signals may be input/output to/from the circuit element through the chip pads. Referring to FIG. 9B, a mask pattern 20 may be formed on the semiconductor substrate 10 to partially expose an upper surface of the semiconductor substrate 10. According to at least one example embodiment, a photoresist layer may be formed on the semiconductor substrate 10 and then patterned to form the mask pattern 20.

Figure 9C:
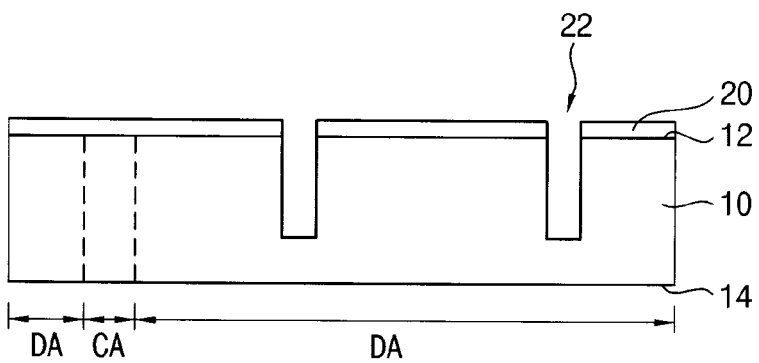

Referring to FIG. 9C, the mask pattern 20 may be used as an etch mask to form an opening 22 in the semiconductor substrate 10. According to at least one example embodiment, after the semiconductor substrate 10 is loaded into a chamber (e.g., the chamber 102 in FIG. 1), a first gas for plasma etching and a second gas for plasma deposition may be introduced into the chamber 102. For example, the first gas may include at least $SF_6$ and the second gas may include at least $C_4F_8$. Plasma power may be applied to generate plasma within the chamber 102. For example, a pressure of the chamber 102 may range from about 10 mT to about 90 mT, a RF power may range from about 1000 W to about 3000 W and a bias voltage may range from about 200 V to about 600 V.

The flow rate of the first and second gases may be changed periodically during a process cycle, such that a plasma etch process and a plasma deposition process may be performed together to form the opening 22 in the semiconductor substrate 10. For example, the first gas may be activated to etch the semiconductor substrate 10 in a vertical direction, and the second gas may be activated to form a protection layer on a sidewall of the etched opening 22. The processes that are, for example, illustrated with reference to FIGS. 4A and 4B may be performed to form the opening 22 to a desired depth and width. The opening 22 may be formed on a redistribution pad (not illustrated), so that the opening 22 may penetrate the redistribution pad. The redistribution pad may be formed on the first surface 12 of the substrate 10 to be electrically connected to the chip pad. According to example embodiments, the opening 22 may be formed on a region for the chip pad to be formed so that the opening 22 penetrates the chip pad.

According to at least one example embodiment, a flow rate of the first gas may be changed periodically within a range of flow rates and an flow rate of the second gas may be changed periodically within a range of flow rates. The total amount of the first gas and the second gas as a function of time may be about constant over a process cycle. The amount of flow of the first gas may vary according to a first phase and the amount of flow of the second gas may vary according to a second phase different from the first phase. The difference between the first phase and the second phase may be from about 90° to about 180°.

For example, the phase difference between the first gas and the second gas may be about 180°. When the amount of flow of the first gas is at a maximum value, the amount of flow of the second gas may at a minimum value. When the amount of flow of the first gas is at a minimum value, the amount of flow of the second gas may be at a maximum value. The maximum amount of flow of the first gas may be the same as the maximum amount of flow of the second gas. The minimum amount of flow of the first gas may be the same as the minimum amount of flow of the second gas. When the amount of flow of the first gas is gradually increased, the amount of flow of the second gas may be gradually decreased. When the amount of flow of the first gas is gradually decreased, the amount of flow of the second gas may be gradually increased.

Figure 9D:
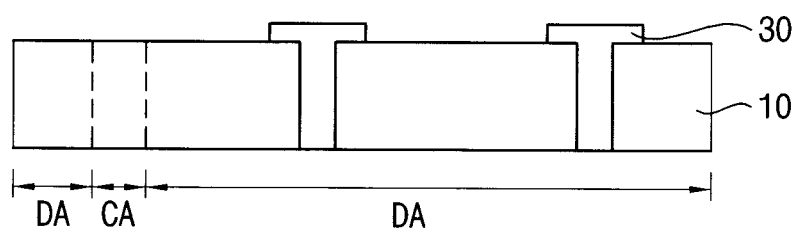

Referring to FIG. 9D, the opening 22 may be filled with a conductive material to form a plug 30. According to at least one example embodiment, after an insulation layer (not illustrated) is formed on inner walls of the opening 22, a seed layer (not illustrated) may be formed on the first surface 12 of the substrate 10 including the opening 22. The seed layer may be formed by, for example, a sputtering process. The seed layer may be formed using a metal with a high and/or increased adhesive property and excellent and/or improved wettability to a plug that may be formed by a following process. The seed layer may include, for example, titanium/copper (Ti/Cu), titanium/palladium (Ti/Pd), titanium/nickel (Ti/Ni), and/or chromium/copper (Cr/Cu).

An electroplating process may be performed to form the plug 30 filling up the opening 22. For example, the plug 30 may include gold (Au), silver (Ag), copper (Cu), and/or platinum (Pt). The plug 30 may be formed by a chemical vapor deposition process and/or a physical vapor deposition process, and/or the plug 30 may be formed by performing a film forming process and an etch-back process repeatedly. The second surface 14 of the substrate 10 may be partially removed to expose a lower portion of the plug 30 from the second surface 14 of the substrate 10. The second surface 14 of the substrate 10 may be removed by, for example, a planarization process and/or an etch process. For example, the second surface 14 of the substrate 10 may be partially removed by a chemical mechanical polishing process.

Figure 9E:
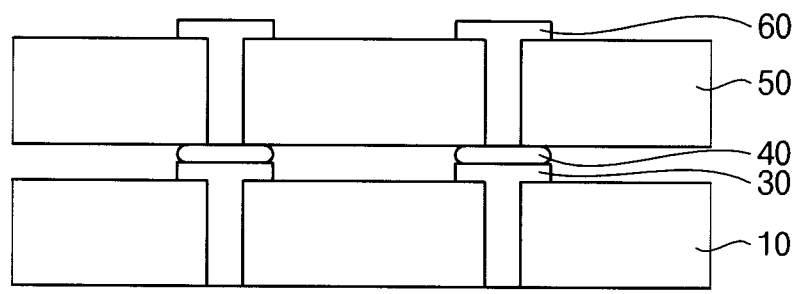

Referring to FIG. 9E, after the cutting region (CA) of the substrate 10 is partially removed by a sawing process to form first and second semiconductor chips respectively, a connection member 40 may be formed on the plug 30 of the first semiconductor chip. The second semiconductor chip 50 may be stacked on the first semiconductor chip such that the connection member 40 may be used to electrically connect the plug 30 of the first semiconductor chip and the plug 60 of the second semiconductor chip. The first and second semiconductor chips may be mounted on a mounting substrate (not illustrated) to form a stack package, According to example embodiments, methods of manufacturing a semiconductor device may include using a first gas for plasma etching and a second gas for plasma deposition. The first and second gasses may be introduced together onto a semiconductor substrate. A flow rate of the first and second gases may be changed periodically such that a plasma etch process and a plasma deposition process are performed together to form an opening in the semiconductor substrate. The plasma etch process due to the first gas may be performed with the plasma deposition process due to the second gas in the same step of a process cycle. Even though the plasma etch process due to the first gas is mainly performed to increase an etch ratio, the plasma deposition process due to the second gas may be performed together with the plasma etch process to protect a sidewall of the etched opening, thereby forming the opening with an excellent and/or improved surface roughness.

While example embodiments have been particularly shown and described, it will be understood by one of ordinary skill in the art that variations in form and detail may be made therein without departing from the spirit and scope of the claims.

What is claimed is:

1. A method of manufacturing a semiconductor device, comprising:
   forming a mask pattern on a first semiconductor substrate;
   introducing a first gas for plasma etching and a second gas for plasma deposition into a plasma processing apparatus in which the first semiconductor substrate is mounted;
   forming an opening in the first semiconductor substrate by periodically varying flow rates of the first and second gases within a range of flow rates during a process cycle such that a plasma etch process and a plasma deposition process are performed together;
   forming an insulation layer on inner walls of the opening;
   forming a plug in the opening;
   forming a connection member on the plug; and
   stacking a second semiconductor substrate on the first semiconductor substrate such that the connection member electrically connects the first and second semiconductor substrates.

2. The method of claim 1, wherein a total amount of the first gas and the second gas as a function of time is about constant over the process cycle.

3. The method of claim 1, wherein when the flow rate of the first gas is a maximum flow rate of the range of flow rates, the flow rate of the second gas is a minimum flow rate of the range of flow rates.

4. The method of claim 1, wherein a maximum flow rate of the first gas is substantially the same as a maximum flow rate of the second gas.

5. The method of claim 1, wherein a minimum flow rate of the first gas is substantially the same as a minimum flow rate of the second gas.

6. The method of claim 1, wherein when the flow rate of the first gas is increased the flow rate of the second gas is decreased.

7. The method of claim 1, wherein
   the process cycle includes one period of the periodically varying flow rates;

a ratio of the flow rate of the first gas to the flow rate of the second gas is greater than 1 during a first time period of the process cycle; and a ratio of the flow rate of the first gas to the flow rate of the second gas is less than 1 during a second time period of the process cycle.

8. The method of claim 1, wherein the first gas comprises $SF_6$ and the second gas comprises $C_4F_8$.

9. The method of claim 1, wherein the periodically varying flow rates of the first and second gases continuously varies the flow rates of the first and second gases in an alternating manner substantially throughout the process cycle.

10. The method of claim 1, wherein the forming of the opening comprises:

supplying the first gas at a periodically varying flow rate with a first phase, and supplying the second gas at a periodically varying flow rate with a second phase different from the first phase.

11. The method of claim 10, wherein the phase difference between the periodic variation of the first gas and the periodic variation of second gas is about 180°.

12. A method of manufacturing a semiconductor device, comprising:

loading a first semiconductor substrate into a plasma process apparatus;

varying a flow rate of a first process gas for plasma etching in the plasma process apparatus according to a first periodic function during a process cycle;

varying a flow rate of a second process gas for plasma deposition in the plasma process apparatus according to a second periodic function during the process cycle;

forming an opening in the first semiconductor substrate by performing a plasma etching process and a plasma deposition process together;

forming an insulation layer on inner walls of the opening;

forming a plug in the opening;

forming a connection member on the plug; and stacking a second semiconductor substrate on the first semiconductor substrate such that the connection member electrically connects the first and second semiconductor substrates.

13. The method of claim 12, wherein the flow rate of the first process gas bears a negative correlation to the flow rate of the second process gas.

14. The method of claim 12, wherein the first and second periodic functions are periodic step functions.

15. The method of claim 14, wherein the first and second periodic step functions include at least 4 steps in one period.

16. The method of claim 15, wherein the first and second periodic step functions include at least 10 steps in one period.

17. The method of claim 12, wherein the first and second periodic functions differ by phase.

18. The method of claim 17, wherein
the first process gas is a plasma etch gas, and
the second process gas is a plasma deposition gas.

19. The method of claim 17, wherein
the phase difference between the first and second periodic functions is about 180°; and
a sum of the first and second flow rates is greater when the first and second flow rates are equal than when the first flow rate is at a maximum flow rate and the second flow rate is at a minimum flow rate.

20. The method of claim 17, wherein
the phase difference between the first and second periodic functions is about 180°; and
a sum of the first and second flow rates is greater when the first and second flow rates are equal than when the second flow rate is at a maximum flow rate and the first flow rate is at a minimum flow rate.

* * * * *